United States Patent [19]

Gventer

[11] 4,307,173

[45] Dec. 22, 1981

[54] LIGHT-SENSITIVE COMPOSITION COMPRISING PHTHALIC ANHYDRIDE

[75] Inventor: Henry W. Gventer, Florham Park, N.J.

[73] Assignee: American Hoechst Corporation, Somerville, N.J.

[21] Appl. No.: 234,031

[22] Filed: Feb. 12, 1981

Related U.S. Application Data

[63] Continuation-in-part of Ser. No. 161,849, Jun. 23, 1980, abandoned.

[51] Int. Cl.$^3$ ............................................... G03C 1/52
[52] U.S. Cl. .................................... 430/165; 430/191; 430/192; 430/193
[58] Field of Search ................ 430/191, 192, 193, 165

[56] References Cited

U.S. PATENT DOCUMENTS

| 2,374,563 | 4/1945 | Reichel | 430/191 |
| 4,009,033 | 2/1977 | Bakos et al. | 430/191 |
| 4,115,128 | 9/1978 | Kita | 430/191 |

*Primary Examiner*—Won H. Louie, Jr.
*Attorney, Agent, or Firm*—Richard S. Roberts

[57] ABSTRACT

Disclosed is an improved photosensitive composition having increased light sensitivity. Said composition comprises an O-quinone diazide, phthalic anhydride and an aromatic sulfonic acid.

14 Claims, No Drawings

LIGHT-SENSITIVE COMPOSITION COMPRISING PHTHALIC ANHYDRIDE

CROSS-REFERENCE TO RELATED APPLICATION

This application is a continuation-in-part of U.S. patent application Ser. No. 06/161,849 filed June 23, 1980, now abandoned which application is incorporated herein by reference.

BACKGROUND OF THE INVENTION

This invention relates to a light-sensitive copying material containing an ooquinone diazide compound as a light-sensitive component.

It is known that o-quinone diazide compounds decompose at the diazo group upon radiation with actinic rays to become carboxyl group-bearing compounds. When a copying layer containing an o-quinone diazide compound is imagewise exposed and then treated with an alkaline developer, therefore, the exposed area is removed and the non-exposed area remains as an image. Accordingly, an o-quinone diazide compound has become noted as a light-sensitive component of the so-called positive type. These compositions comprise generally not only an o-quinone diazide compound but also an alkali-soluble resin such as a phenol-formaldehyde resin to reinforce the image strength and to increase the film-forming properties, and can preferably be used in the form of a uniform composition, in addition, with additives such as dyes and plasticizers.

Unfortunately, these resins and additives tend to compete with the diazide for the ultraviolet exposure radiation and absorb substantial quantities of such radiation. The net effect is a composition having overall reduced light sensitivity.

SUMMARY OF THE INVENTION

Efforts to overcome these disadvantages have been made and, consequently, it has been found that the above described problems can be solved by incorporating phthalic anhydride and an aromatic sulfonic acid into the photosensitive composition. That is, the present invention provides a light-sensitive composition having increased photosensitivity which comprises an o-quinone diazide, phthalic anhydride and an aromatic sulfonic acid, particularly p-toluene sulfonic acid. The invention further comprises a photographic element such as a printing plate, photoresist or color proofing sheet which comprises a substrate having a layer of the diazide-phthalic anhydride-aromatic sulfonic acid composition coated on at least one side thereof.

DETAILED DESCRIPTION OF THE PREFERRED EMBODIMENT

As hereinbefore mentioned, the present invention comprises an improved photosensitive composition which contains an o-quinone diazide, phthalic anhydride and an aromatic sulfonic acid.

The o-quinone diazide compound of the invention can be selected from a great number of compounds of various structures having at least one o-quinone diazide group, in which the alkali-solubility is increased upon irradiation with actinic rays. Such o-quinone diazide compounds are described in detail in J. Kosar, *Light-Sensitive Systems*, p. 339–352, John Wiley & Sons, Inc., which can be used in the present invention. In particular, various aromatic polyhydroxy compounds and o-quinone diazide sulfonic acid esters are preferred.

Typical examples of aromatic polyhydroxy compounds and o-quinone diazide sulfonic acid esters are 2,2'-dihydroxy-diphenyl-bis-(naphthoquinone-1,2-diazide-5-sulfonic acid ester), 2,3,4-trioxybenzophenone-bis-(naphthoquinone-1,2-diazide-5-sulfonic acid ester), 2,7-dihydroxynaphthalene-bis-(naphthoquinone-1,2-diazide-5-sulfonic acid ester) and the ester of a phenol-formaldehyde resin and naphthoquinone-1,2-diazide-5-sulfonic acid. The naphthoquinone-1,2-diazide-5-sulfonic acid ester of the polyhydroxy-phenyl obtained by the polycondensation of acetone and pyrogallol described in U.S. Pat. No. 3,635,709 and the diazides described in U.S. Pat. No. 3,046,118 can be advantageously used and are incorporated herein by reference.

The composition of this invention may be used alone or in combination with other resins and additives for subsequent coating on a substrate to form a light-sensitive element. As the resin to be mixed with the o-quinone diazide compound, alkali-soluble resins, for example, phenol resins, cresol resins, styrene/maleic anhydride copolymers, shellac and phenol-formaldehyde resins are suitable.

If desired, various organic or inorganic additives can be incorporated in a suitable amount in the organic coating. For example, dyes such as Crystal Violet and Oil Blue, or pigments such as Phthalocyanine Blue can be added to color the coating, and fillers or plasticizers such as titanium dioxide dimethyl phthalate, and clays, can be added to increase the mechanical strength of the coating.

In practice, the composition of the present invention is dissolved in a suitable solvent and coated. Examples of suitable solvents are ethylene glycol monoalkyl ethers such as ethylene glycol monomethyl ether and ethylene glycol monoethyl ether, their acetic acid esters such as ethylene glycol monomethyl ether acetate and ethylene glycol monoethyl ether acetate, ketones such as methyl ethyl ketone, methyl isobutyl ketone and cyclohexanone, butyl acetate, dioxane, pyridine and dimethylformamide.

Suitable supports which can be used are metal sheets such as aluminum or aluminum alloy sheets, zinc sheets and copper sheets, nitrocellulose films, cellulose diacetate films, cellulose triacetate films, cellulose butyrate films, cellulose acetate butyrate films, polyethylene terephthalate films, polystyrene films, polycarbonate films, polyethylene films, polypropylene films, papers, polyethylene- or polystyrene-laminated papers and glass sheets. Where the light-sensitive copying material of the invention is used as a light-sensitive lithographic printing plate, in particular, the surface of a support should be hydrophilic. In this case, an aluminum sheet is most preferably used as the support, which is preferably surface treated by graining or by anodic oxidation. Furthermore, an aluminum sheet subjected to a treatment with an aqueous solution of sodium silicate after sand blasting as described in U.S. Pat. No. 2,714,066 and an aluminum sheet subjected to an anodic oxidation treatment and then to a treatment with an aqueous solution of an alkali metal silicate as described in U.S. Pat. No. 3,181,461 are preferably used. The above described anodic oxidation treatment is, for example, carried out by passing an electric current through an aluminum sheet as anode in an electrolyte of one or more of aqueous or non-aqueous solutions of inorganic acids such as phosphoric acid, chromic acid, sulfuric acid and boric acid and organic acids such as oxalic acid and sulfamic acid.

The light-sensitive copying material of the present invention is imagewise exposed to active rays such as radiation from a mercury lamp, xenon lamp or carbon arc lamp and then developed. While the exposure time and the amount of exposure can vary, a suitable exposure time can range from about 5 seconds to 5 minutes, preferably about 5 seconds to 1 minute. Suitable developers which can be used are alkali solutions, which have hitherto been known as developers for a light-sensitive layer of an o-quinone diazide compound, for example, aqueous solutions of inorganic alkalis such as sodium hydroxide, potassium hydroxide, sodium silicate, potassium silicate, sodium triphosphate, potassium triphosphate, sodium carbonate and potassium carbonate and basic solvents such as monoethanolamine, diethanolamine, propanolamine and morpholine. A suitable developer solution concentration can range from about 1 to 20% by weight, preferably 2 to 15% by weight. If desired, organic solvents and surface active agents can be added to these aqueous solutions. Where the wetting and permeation of the developer is reduced by the used of laminated organic coatings than the wetting and permeation of an o-quinone diazide light-sensitive layer alone, it is desirable to add a suitable amount of an organic solvent such as n-propyl alcohol or a surfactant such as sodium lauryl sulfate.

It has been found that the light sensitivity of the composition of this invention may be particularly increased by the use of p-toluene sulfonic acid as the sulfonic acid of this invention. Increased light sensitivity was also noticed with the addition of phthalic acid. These ingredients enhance the compatibility of the coating composition ingredients and aid in the elimination of any residue or blushing left after development if higher concentrations of phthalic anhydride are used without the acid.

Non-limiting preferred ratios of ingredients which comprise the composition of the instant invention are as follows in percent by weight of the dry components of the composition.

| | |
|---|---|
| diazide | 30%–50% |
| phthalic anhydride | 6%–50% |
| alkali soluble resins | 0–10% |
| dyes | 0–40% |
| p-toluene sulfonic acid | 0–10% |

Preferably, when this composition is coated onto a substrate to form a photographic element, it is applied at a dry coating weight ranging from 50 mg to 1 gram per square meter of substrate. A more preferred range is from 300–600 mg/M$^2$.

The following examples are given in order to illustrate the invention in greater detail without limiting the same. All parts, percents, ratios and the like are by weight.

EXAMPLE 1

The following components were admixed into a solvent system comprising methyl cellosolve and methyl ethyl ketone:

| | |
|---|---|
| EDM-383 (quinone diazide obtained from Kalle AG, Wiesbaden, West Germany) | 1,359.4 g |
| Novalac resin | 25.0 g |
| Orasol Yellow 3GLG dye | 79.8 g |
| Orasol Black RL dye | 636.0 g |

This composition was coated onto a transparent polyester sheet and the solvents were then evaporated to produce a 400 mg/sq. meter coating on the sheet. The thusly produced photographic element was then exposed, through a Stauffer 21 Step Exposure Scale, in a Berkey Ascor exposure unit by a method well-known in the art. The exposed element was then developed in a dilute alkali solution. It was determined that 40 Berkey Ascor Exposure units of light were required to obtain a satisfactory exposure of the step scale. This was obtained when step 2 on the scale developed clear and step 3 developed to a gray tone.

EXAMPLE 2

Example 1 was repeated except 800 g of phthalic anhydride was incorporated into the admixture. It was determined that only 20 Berkey Ascor exposure units were required to satisfactorily expose the step scale to obtain a clear step 2 and gray step 3. This demonstrates a substantial increase in exposure speed when phthalic anhydride is incorporated into the coating composition.

EXAMPLE 3

Example 2 was repeated except 150 grams of p-toluene sulfonic acid was also incorporated into the coating composition. Similar results were obtained.

EXAMPLE 4

The following three compositions were formulated by admixture in a solvent system comprising methyl cellosolve and methyl ethyl ketone. All parts are by weight.

| | Control A | B | C |
|---|---|---|---|
| EDM-383 (quinone diazide obtained from Kalle AG, Weisbaden, West Germany) | 64.734 | 46.878 | 45.315 |
| p-toluene sulfonic acid | — | — | 3.333 |
| Novalac resin | 1.190 | 0.860 | 0.833 |
| Orasol Yellow 3GLG dye | 3.790 | 2.745 | 2.653 |
| Orasol Black RL dye | 30.286 | 21.931 | 21.200 |
| phthalic anhydride | — | 27.586 | 26.666 |
| | 100.00 | 100.00 | 100.00 |

These compositions were coated onto transparent polyester sheets and the solvents were then evaporated to produce 400 mg/sq. meter coatings on the sheets. The thusly produced photographic elements were then exposed, through a Stauffer 21 Step Exposure Scale, in a Berkey Ascor exposure unit by a method well-known in the art. The exposed element was then developed in a dilute alkali solution. The number of Berkey Ascor exposure units of light required to obtain a satisfactory exposure of the step scale was then determined. This was obtained when step 2 on the scale developed clear and step 3 developed to a gray tone. It was determined that while sample B required 50% less exposure than the control A to produce an acceptably exposed photographic element, sample C, accordingly produced an acceptably exposed element with 66.7% less light exposure than the control sample A.

What is claimed is:

1. A composition comprising phthalic anhydride, an aromatic sulfonic acid and an o-quinone diazide, said phthalic anhydride and said aromatic sulfonic acid are present in amounts sufficient to increase the light sensitivity of said composition.

2. The composition of claim 1 wherein said aromatic sulfonic acid is p-toluene sulfonic acid.

3. The composition of claim 1, further comprising one or more alkali soluble oleophilic resins.

4. The composition of claim 2 further comprising one or more alkali soluble oleophilic resins.

5. The composition of claim 1 further comprising one or more dyes.

6. The composition of claim 2 further comprising one or more dyes.

7. The composition of claim 3 further comprising one or more dyes.

8. The composition of claim 4 further comprising one or more dyes.

9. The composition of claim 8 comprising in parts by weight, from 30% to 50% o-quinone diazide, from 6% to 50% phthalic anhydride, from 0% to 10% alkali soluble oleophilic resins, up to 10% p-toluene sulfonic acid and from 0% to 40% dyes.

10. A photographic element comprising a substrate and a coating on at least one side of said substrate, said coating comprising the composition of claim 1, 2, 3, 4, 5, 6, 7, 8, or 9.

11. A photographic element comprising a transparent substrate and a coating on at least one side of said substrate, said coating comprising the composition of claim 1, 2, 8 or 9.

12. A photographic element comprising a metallic substrate and a coating on at least one side of said substrate, said coating comprising the composition of claim 1, 2, 8 or 9.

13. The composition of claim 8 or 9 wherein said alkali soluble oleophilic resin is a phenol-formaldehyde resin.

14. The composition of claim 1 further comprising phthalic acid.

* * * * *